United States Patent
Tseng

(10) Patent No.: US 10,325,952 B2
(45) Date of Patent: Jun. 18, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Chi Sheng Tseng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/644,650

(22) Filed: Jul. 7, 2017

(65) Prior Publication Data

US 2019/0013346 A1    Jan. 10, 2019

(51) Int. Cl.
*H01L 27/146* (2006.01)

(52) U.S. Cl.
CPC .......... *H01L 27/14636* (2013.01); *H01L 27/14618* (2013.01); *H01L 27/14627* (2013.01); *H01L 27/14643* (2013.01); *H01L 27/14685* (2013.01); *H01L 27/14689* (2013.01)

(58) Field of Classification Search
CPC ........... H01L 27/146; H01L 27/14636; H01L 27/14627; H01L 27/14645; H01L 27/14647; H01L 27/14665; H01L 27/14618; H01L 27/14685; H01L 27/14689
See application file for complete search history.

(56) References Cited

U.S. PATENT DOCUMENTS

| | | | |
|---|---|---|---|
| 7,781,781 B2 | 8/2010 | Adkisson et al. | |
| 2003/0077508 A1* | 4/2003 | Asahina | H01M 2/0237 429/160 |
| 2004/0165098 A1* | 8/2004 | Ikeda | H01L 27/14618 348/340 |
| 2008/0164550 A1* | 7/2008 | Chen | H01L 27/14618 257/432 |
| 2008/0246136 A1* | 10/2008 | Haba | H01L 23/3128 257/686 |
| 2012/0044636 A1* | 2/2012 | Rothkopf | G06F 1/1626 361/679.55 |

OTHER PUBLICATIONS

"Chip level molding dispensing interconnection CIS Package", http://www.kipo.go.kr/kpo/user.tdf;jsessionid= 9863ca6b30d6711c292f9214e7da857bbd0605073bc. e34RahyTbxmRb40Laxy . . . , downloaded Jul. 12, 2017, 2 pages.
(Continued)

*Primary Examiner* — Galina G Yushina
(74) *Attorney, Agent, or Firm* — Foley & Lardner LLP; Cliff Z. Liu

(57) ABSTRACT

An image sensor comprises a chip, a first redistribution layer (RDL), a second RDL and a third RDL. The chip has a first surface, a second surface opposite to the first surface and a lateral surface extending between the first surface and the second surface. The first RDL is disposed on the first surface of the chip and extends along the first surface of the chip and beyond the lateral surface of the chip. The second RDL is disposed on the second surface of the chip. The third RDL is disposed on the lateral surface of the chip and connects the first RDL to the second RDL.

15 Claims, 25 Drawing Sheets

(56) References Cited

OTHER PUBLICATIONS

Samsung Semiconductor Global, "Mobile, including wearable devices and loT (Internet of Things), data centers for cloud computing, and smart automotives are the most important key trends in the semiconductor industry today", <http://www.samsung.com/semiconductor/support/package-information/overview/>, copyright 1995-2017 Samsung, 5 pages.

Image Sensors World, "Kingpak Compares CIS Packages", <http://image-sensors-world.blogspot.tw/2013/11/kingpak-compares-cis-packages.html>, Nov. 27, 2013, 8 pages.

\* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. More particularly, the present disclosure relates to a semiconductor package device including an image sensor and a method of manufacturing the same.

2. Description of the Related Art

In a Complementary Metal-Oxide-Semiconductor (CMOS) image sensor, an active side and a back side of the image sensor can be electrically connected by a through silicon via (TSV). However, the use of the TSV would increase the manufacturing cost and complexity.

SUMMARY

In one or more embodiments, an image sensor comprises a chip, a first redistribution layer (RDL), a second RDL and a third RDL. The chip has a first surface, a second surface opposite to the first surface and a lateral surface extending between the first surface and the second surface. The first RDL is disposed on the first surface of the chip and extends along the first surface of the chip and beyond the lateral surface of the chip. The second RDL is disposed on the second surface of the chip. The third RDL is disposed on the lateral surface of the chip and connects the first RDL to the second RDL.

In one or more embodiments, an image sensor comprises a substrate, a micro-lens array, a first RDL and a second RDL. The substrate has a first surface, a second surface opposite to the first surface and a lateral surface extending between the first surface and the second surface. The micro-lens array is disposed on the first surface of the substrate. The first RDL is disposed on the first surface of the substrate and includes a protruded portion extending beyond the lateral surface of the substrate. The second RDL is disposed on the lateral surface of the substrate and contacts the protruded portion of the first RDL. A contacting area of the first RDL and the second RDL is greater than a cross-sectional area of the second RDL.

In one or more embodiments, a method of manufacturing an image sensor comprises (a) providing a substrate having a first surface and a second surface opposite to the first surface, the substrate having a first cutting channel therein; (b) forming a first RDL on the first surface, the first RDL extending within the first cutting channel, the first RDL having a bottom surface facing toward the first surface of the substrate; (c) removing a portion of the substrate within the first cutting channel to expose a surface of the substrate and expose the bottom surface of the first RDL; and (d) forming a second RDL extending along the exposed surface of the substrate to contact the bottom surface of the first RDL.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
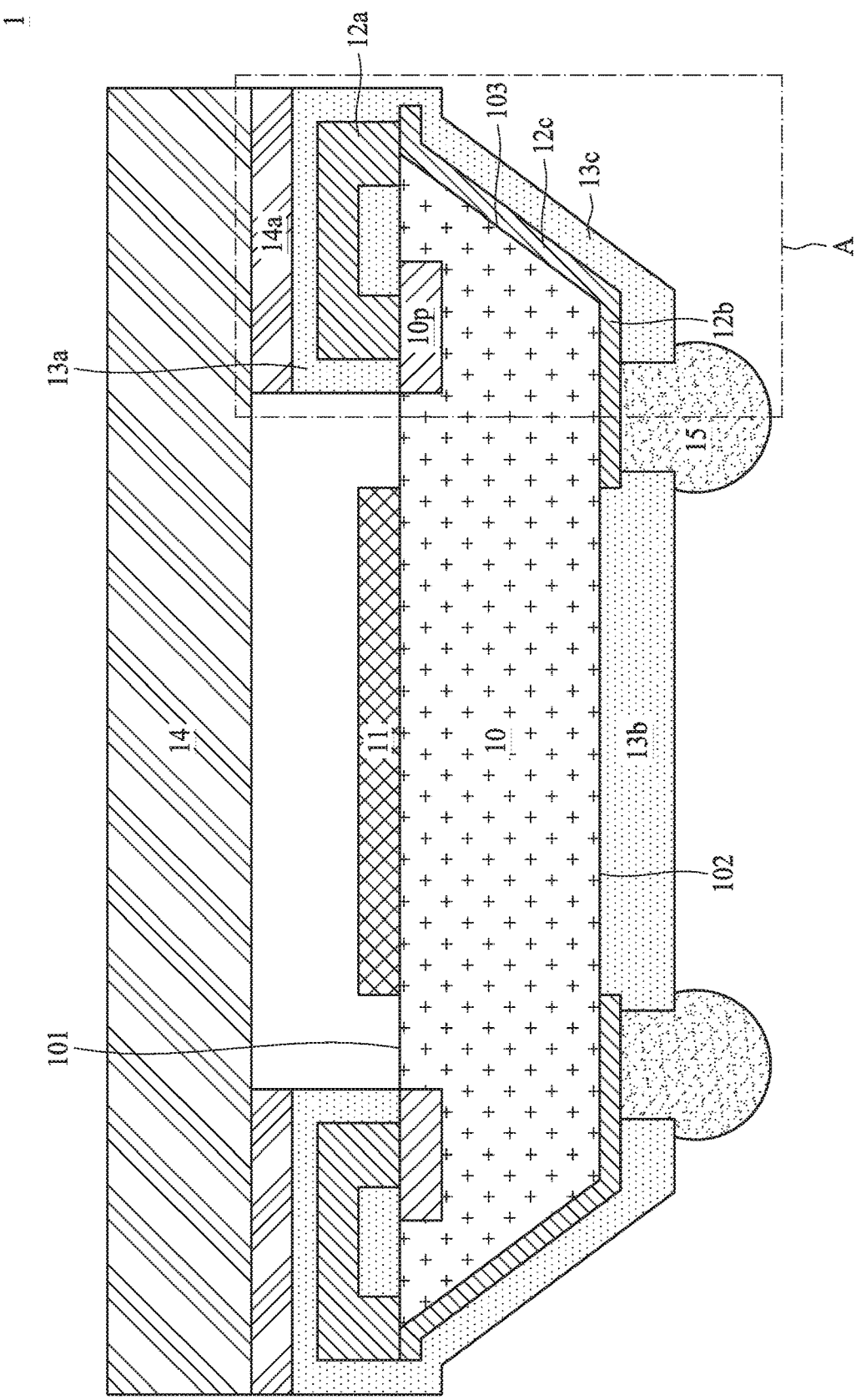
FIG. 1A illustrates a cross-sectional view of a semiconductor package device in accordance with some embodiments of the present disclosure.

FIG. 1A illustrates a cross-sectional view of a semiconductor package device 1 in accordance with some embodiments of the present disclosure. The semiconductor package device 1 includes a chip (or a die) 10, conductive layers 12a, 12b, 12c, dielectric layers 13a, 13b, 13c, a cover 14, and one or more electrical contacts 15.

The chip 10 has an active surface 101 (also referred to as a "first surface"), a back surface 102 (also referred to as a "second surface") opposite to the active surface 101 and a lateral surface 103 extending between the active surface 101 and the back surface 102. In some embodiments, the lateral surface 103 is not perpendicular to the active surface 101 or the back surface 102. For example, an angle defined by the active surface 101 and the lateral surface 103 may be an acute angle less than about 90 degrees while an angle defined by the back surface 102 and the lateral surface 103 may be an obtuse angle greater than about 90 degrees. In some other embodiments, the lateral surface 103 may be substantially perpendicular to the active surface 101 or the back surface 102. The chip 10 may include a semiconductor substrate, one or more integrated circuit devices and one or more overlying interconnection structures therein. The integrated circuit devices may include active devices, such as transistors, and/or passive devices, such resistors, capacitors, inductors, or a combination thereof. In some embodiments, the chip 10 may include a micro-lens area 11 on its active surface 101. In some embodiments, the micro-lens area 11 may include a micro-lens array. In some embodiments, the chip 10 may be an image sensor (e.g., CMOS image sensor).

The conductive layer (also referred to as a "redistribution layer," or RDL) 12a is disposed on the active surface 101 of the chip 10 and electrically connected to a conductive pad 10p on the active surface 101 of the chip 10. The conductive layer 12b (or RDL) is disposed on the back surface 102 of the chip 10. The conductive layer 12c (or RDL) is disposed on the lateral surface 103 of the chip 10 and electrically connects the conductive layer 12a with the conductive layer 12b. The conductive layers 12a, 12b, 12c may be formed of metals, metal alloys, or other suitable conductive materials. In some embodiments, two or more of the conductive layers 12a, 12b, 12c may be integrally formed with one another.

Figure 1B:
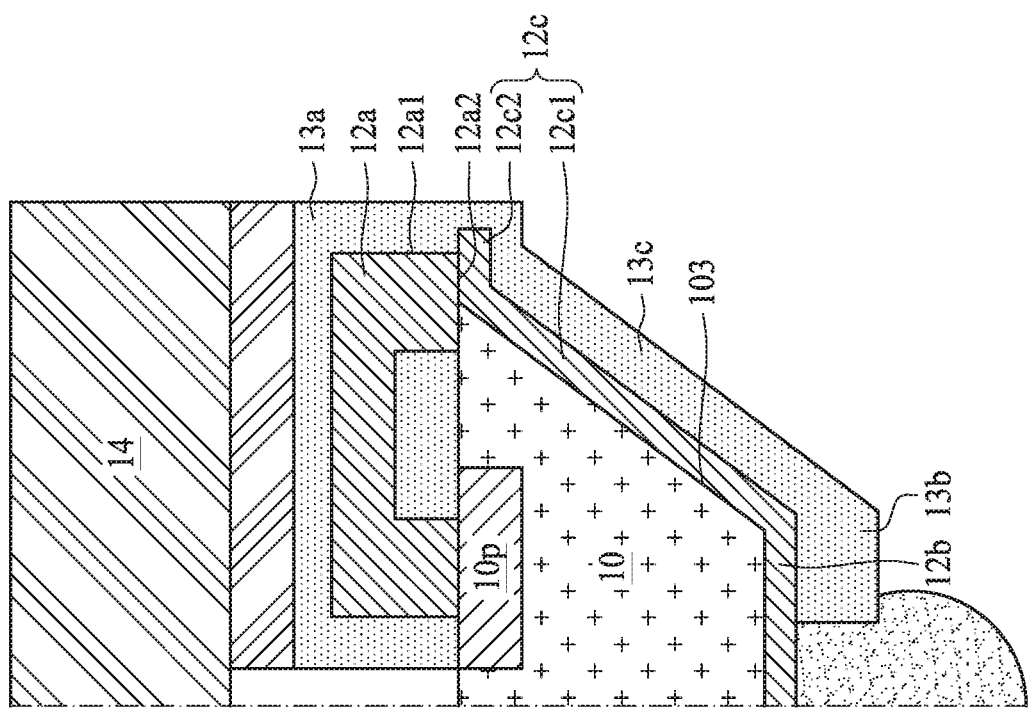
FIG. 1B illustrates an enlarged view of a portion of the semiconductor package device as shown in FIG. 1A in accordance with some embodiments of the present disclosure.

FIG. 1B is an enlarged view of a portion of the semiconductor package device 1 shown in FIG. 1A that is circled by a square A, in accordance with some embodiments of the present disclosure.

As shown in FIG. 1B, the conductive layer 12a extends along the active surface 101 of the chip 10 and over the lateral surface 103 of the chip 10. For example, the conductive layer 12a includes a portion which extends or protrudes beyond an edge defined by the active surface 101 and the lateral surface 103 of the chip 10. The conductive layer 12c includes a first portion 12c1 and a second portion 12c2. The first portion 12c1 of the conductive layer 12c is disposed on the lateral surface 103 of the chip 10. The second portion 12c2 of the conductive layer 12c contacts and extends along a bottom surface 12a2 (facing toward the active surface 101 of the chip 10) of the conductive layer 12a that protrudes beyond the lateral surface 103 of the chip 10. For example, the second portion 12c2 of the conductive layer 12c extends substantially parallel to the active surface 101 of the chip 10. The second portion 12c2 of the conductive layer 12c extends beyond a lateral surface 12a1 of the conductive layer 12a. For example, the second portion 12c2 of the conductive layer 12c protrudes beyond the lateral surface 12a1 of the conductive layer 12a.

Some CMOS image sensors may include a first RDL on an active side of the image sensor and a second RDL on a back side of the image sensor, wherein the second RDL may extend along a lateral surface of the image sensor to electrically connect to the first RDL. However, such connection between the first RDL and the second RDL is achieved by a point-to-point contact or a point-to-line contact, which is relatively weak and may break or cause an open circuit between the first RDL and the second RDL.

Referring to FIG. 1B, since the second portion 12c2 of the conductive layer 12c contacts the bottom surface 12a2 of the conductive layer 12a and extends along the bottom surface 12a2 of the conductive layer 12a, a contacting interface between the conductive layers 12a and 12c is a plane or surface. For example, a connection between the conductive layers 12a and 12c is achieved by a plane-to-plane contact or surface-to-surface contact. For example, a contacting area between the conductive layers 12a and 12c is greater than a cross-sectional area of the conductive layer 12c (e.g., taken along a plane perpendicular to an extending direction of the conductive layer 12c), for example, at least about 1.1 times greater, at least about 1.2 times greater, or at least about 1.3 times greater. Compared to a connection between two conductive layers achieved by a point-to-point contact or a point-to-line contact, the connection (e.g., plane-to-plane contact) between the conductive layers 12a and 12c as shown in FIG. 1B is relatively strong, which would increase the bonding strength between the conductive layers 12a and 12c and mitigate against an open circuit between the conductive layers 12a and 12c.

Figure 1C:
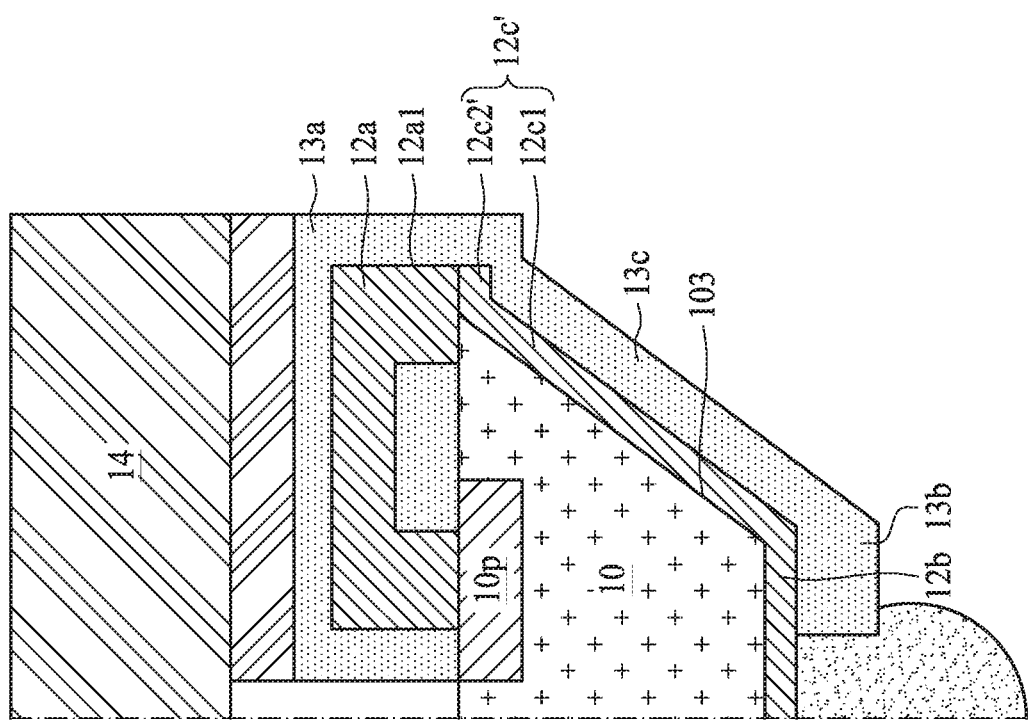
FIG. 1C illustrates an enlarged view of a portion of the semiconductor package device as shown in FIG. 1A in accordance with some embodiments of the present disclosure.

FIG. 1C is an enlarged view of a portion of the semiconductor package device 1 shown in FIG. 1A that is circled by the square A, in accordance with some embodiments of the present disclosure. The structure shown in FIG. 1C is similar to that shown in FIG. 1B except that in the structure shown in FIG. 1C, a second portion 12c2' of a conductive layer 12c' does not extend beyond the lateral surface 12a1 of the conductive layer 12a.

Referring back to FIG. 1A, the dielectric layer 13a is disposed on the active surface 101 of the chip 10 to encapsulate or cover the conductive layer 12a. The micro-lens area 11 of the chip 10 is exposed from the dielectric layer 13a. In some embodiments, the dielectric layer 13a extends beyond the lateral surface 103 of the chip 10. The dielectric layer 13b is disposed on the back surface 102 of the chip 10 to encapsulate or cover the conductive layer 12b. The dielectric layer 13c is disposed on the lateral surface 103 of the chip 10 to encapsulate or cover the conductive layer 12c. In some embodiments, the dielectric layer 13b defines or has openings to expose portions of the conductive layer 12b, and the electrical contacts 15 are respectively disposed on exposed portions of the conductive layer 12b. In some embodiments, the electrical contact 15 is Controlled Collapse Chip Connection (C4) bump, Ball Grid Array (BGA) or Land Grid Array (LGA).

In some embodiments, the dielectric layers 13a, 13b and 13c may include molding compounds, Borophosphosilicate Glass (BPSG), silicon oxide, silicon nitride, silicon oxynitride, Undoped Silicate Glass (USG), polyimide, solder resist, any combination thereof, or another dielectric material of the like. Examples of molding compounds may include, but are not limited to, an epoxy resin including fillers dispersed therein.

The cover 14 is disposed on the dielectric layer 13a to cover the micro-lens area 11 on the active surface 101 of the chip 10. In some embodiments, the cover 14 is formed of, or includes, a glass or another transparent material to allow light to pass through. In some embodiments, the cover 14 is attached to the dielectric layer 13a through an adhesive (e.g., glue or tape) 14a.

Figure 2:
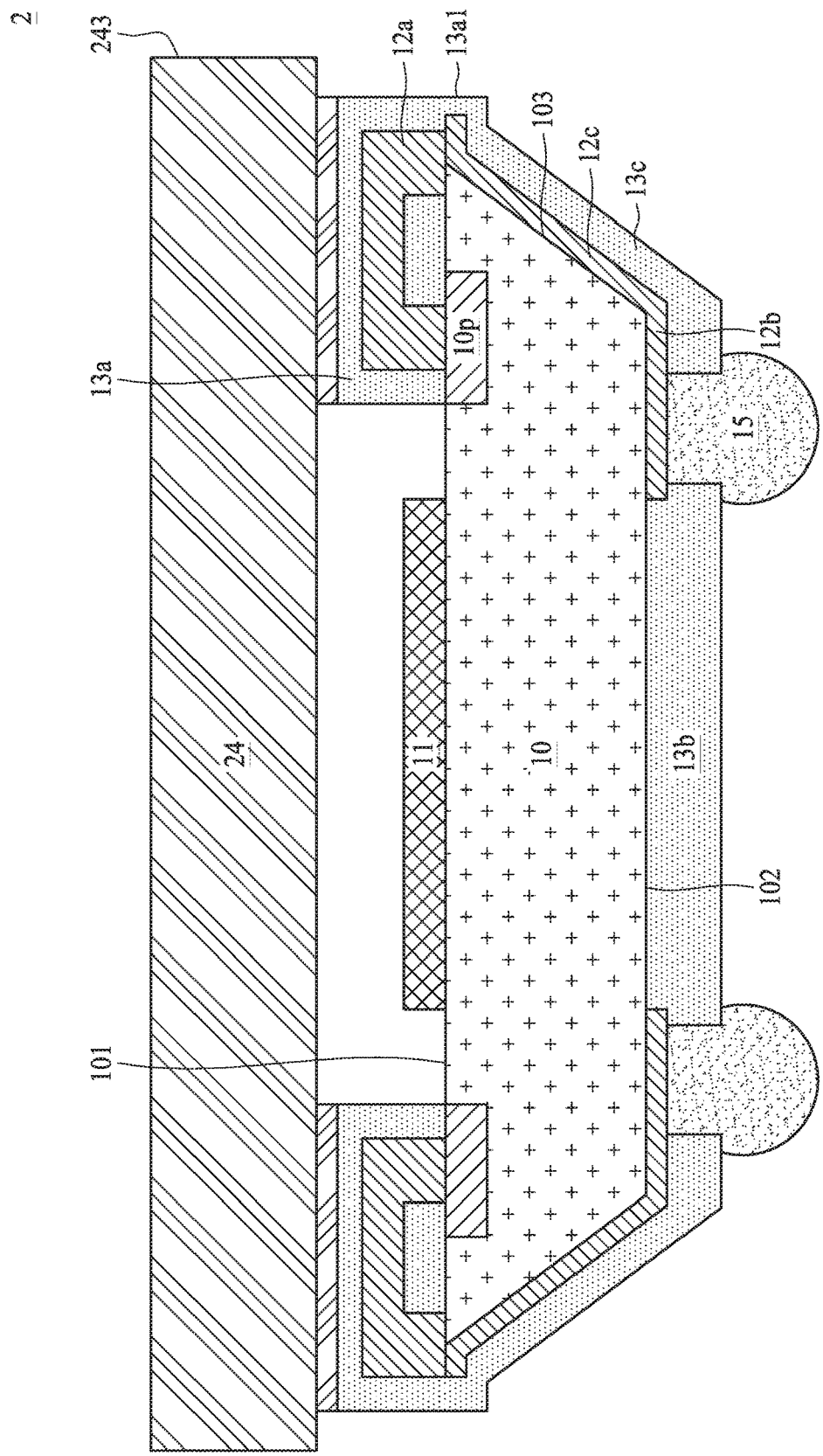
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 shown in FIG. 1A except that in the semiconductor package device 2, a cover 24 protrudes beyond a lateral surface 13a1 of the dielectric layer 13a. For example, a lateral surface 243 of the cover 24 is not coplanar with the lateral surface 13a1 of the dielectric layer 13a.

FIG. 3A through FIG. 3G are cross-sectional views of a semiconductor structure fabricated at various stages, in accordance with some embodiments of the present disclosure.

Figure 3A:
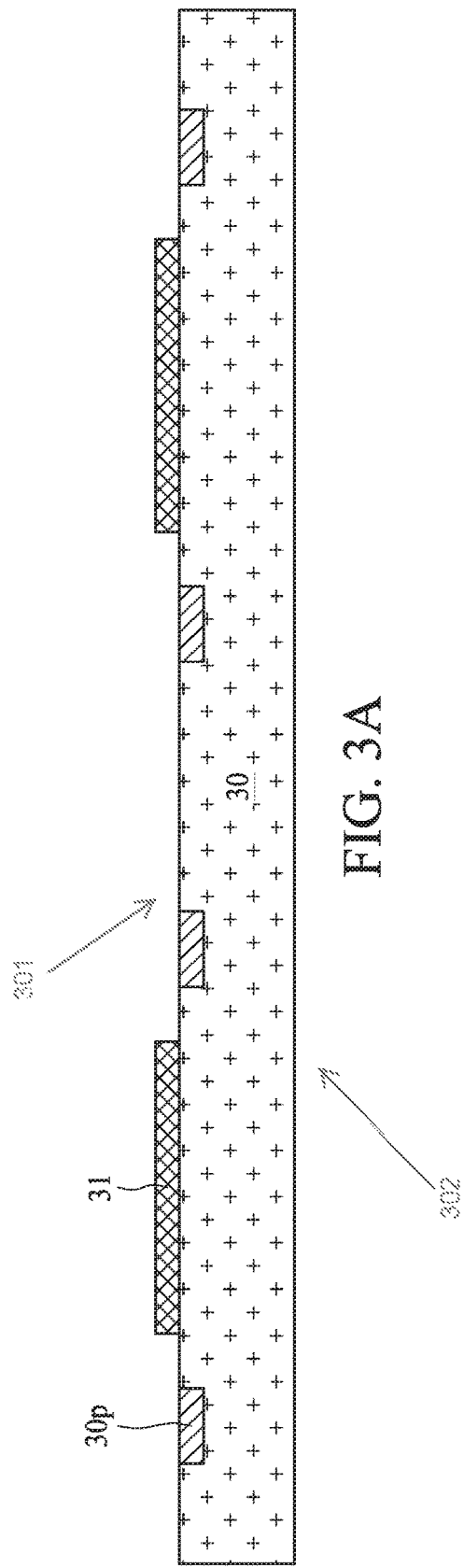
FIG. 3A, FIG. 3B, FIG. 3C, FIG. 3D, FIG. 3E, FIG. 3F and FIG. 3G illustrate various stages of a method of manufacturing a semiconductor package device in accordance with some embodiments of the present disclosure.

Referring to FIG. 3A, a die strip (e.g., a wafer) including a die 30 is provided. The die strip has an active surface 301 (also referred to as a "first surface") and a back surface 302 (also referred to as a "second surface") opposite to the active surface 301. Each die 30 may include a semiconductor substrate, one or more integrated circuit devices and one or more overlying interconnection structures therein. The integrated circuit devices may include one or more active devices, such as transistors, and/or passive devices, such as resistors, capacitors, inductors or a combination thereof. The active surface 301 of each die 30 has a micro-lens area 31 and multiple conductive pads 30p.

Figure 3B:
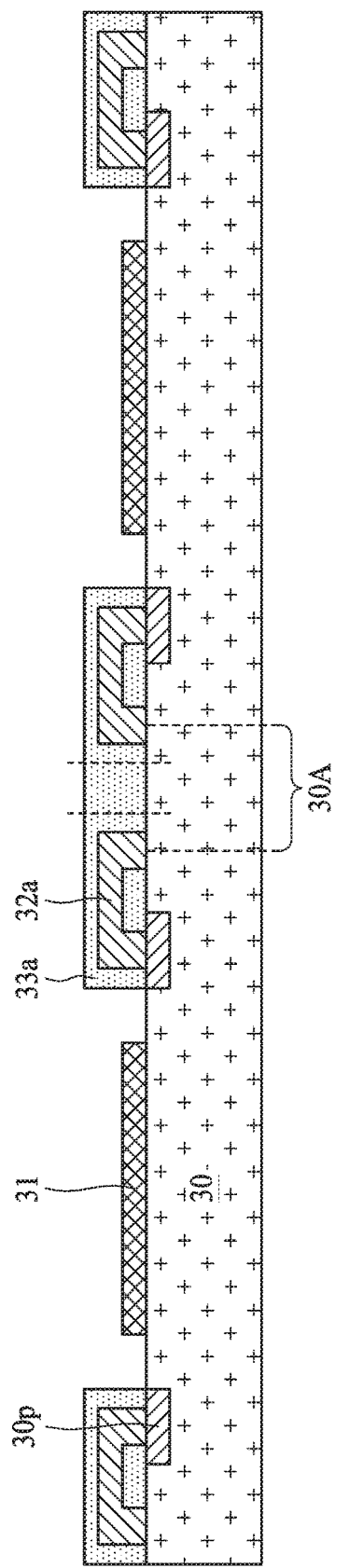

Referring to FIG. 3B, a conductive layer (or RDL) 32a is formed on the active surface 301 of the die 30 and electrically connected to the conductive pad 30p of the die 30. In some embodiments, the conductive layer 32a extends within a cutting channel 30A of the die strip including the die 30. In some embodiments, a dielectric layer 33a is formed on the active surface 301 of the die strip to cover the conductive layer 32a. The dielectric layer 33a may define an opening to expose at least a portion of the active surface 301 (e.g., the micro-lens area 31) of the die strip. In some embodiments, the opening can be formed by, for example, a lithographic technique or other suitable processes. In some other embodiments, the dielectric layer 33a can be omitted depending on design specifications.

Figure 3C:
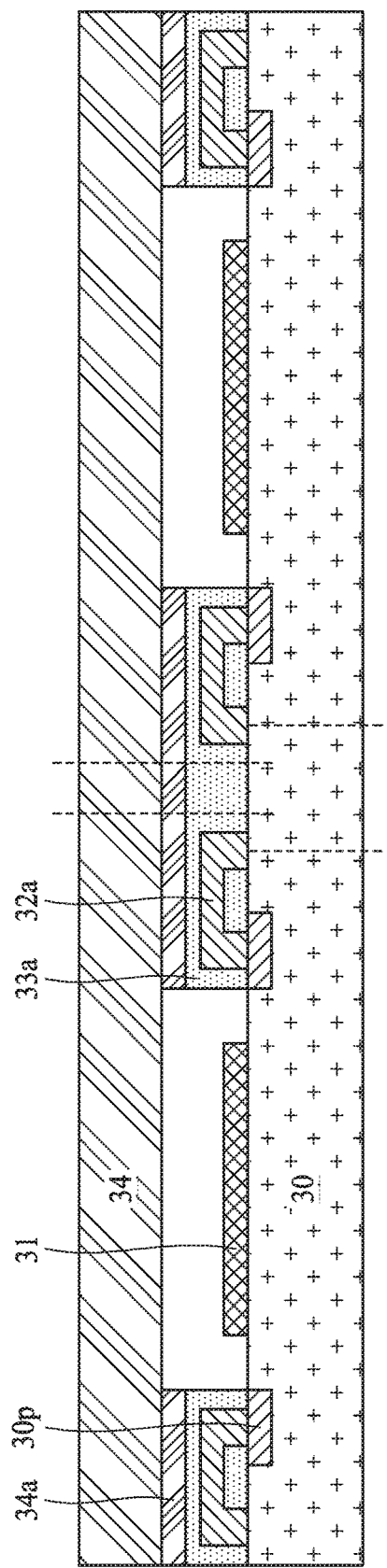

Referring to FIG. 3C, a cover 34 is placed on the dielectric layer 33a to cover the micro-lens area 31 on the active surface 301 of the die 30. In some embodiments, the cover 34 is formed of, or includes, a glass or another transparent material to allow light to pass through. In some embodiments, the cover 34 is attached to the dielectric layer 33a through an adhesive (e.g., glue or tape) 34a.

Figure 3D:
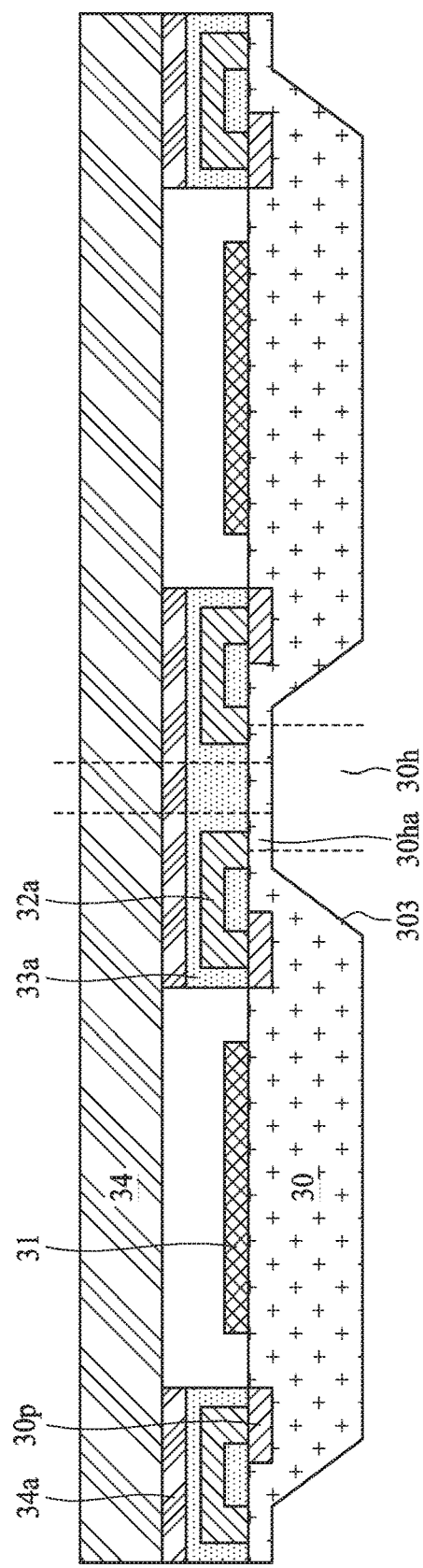

Referring to FIG. 3D, an opening 30h is formed from the back surface 302 of the die strip by removing a portion of the die strip, but not fully cutting through the die strip. For example, two adjacent dies 30 are connected through a remaining portion 30ha. In some embodiments, the opening 30h can be formed by, for example, routing, blade dicing or other suitable processes using a cutting apparatus. In some embodiments, a sidewall 303 of the opening 30h (or the lateral surface 303 of the die 30) is not perpendicular to the active surface 301 or the back surface 302 of the die 30. For example, an angle defined by the active surface 301 and the lateral surface 303 may be less than about 90 degrees while an angle defined by the back surface 302 and the lateral surface 303 may be greater than about 90 degrees. The obtuse angle defined by the back surface 302 and the lateral surface 303 can facilitate the formation of conductive layers or dielectric layers at the following processing stages.

Figure 3E:
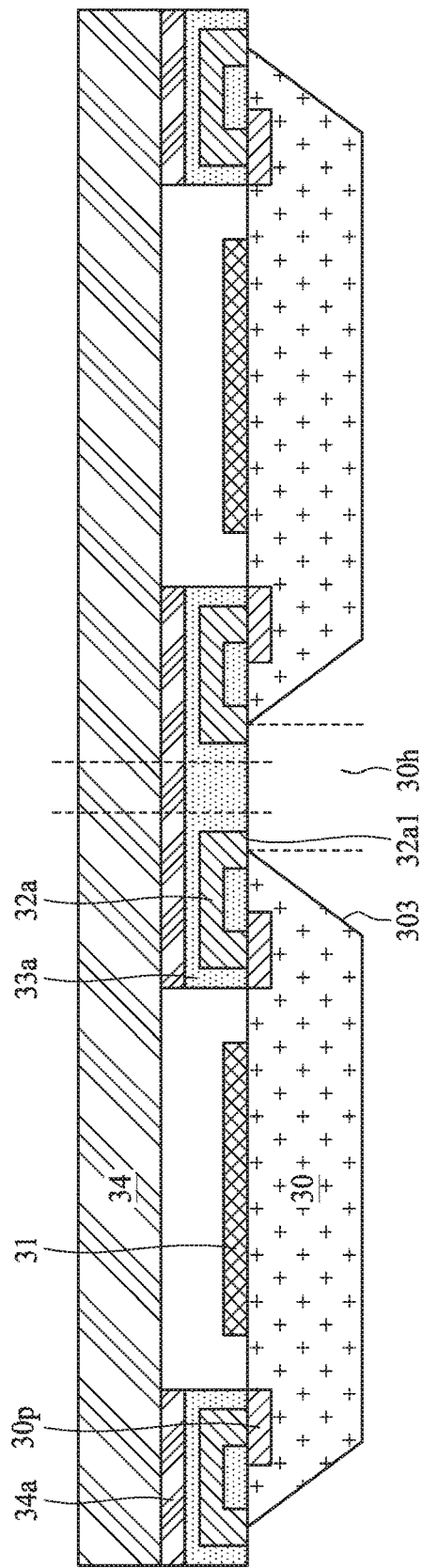

Referring to FIG. 3E, the remaining portion 30ha connecting adjacent dies 30 is removed to expose a bottom surface 32a1 of the conductive layer 32a. In some embodiments, the remaining portion 30ha is removed by plasma etching, reactive-ion etching (RIE), or plasma dicing (e.g., plasma-therm). Due to the selectivity of the etching, the etching process can be terminated at the bottom surface 32a1 of the conductive layer 32a. After the etching process, the conductive layer 32a protrudes beyond an edge defined by the active surface 301 and the lateral surface 303 of the die 30.

Figure 3F:
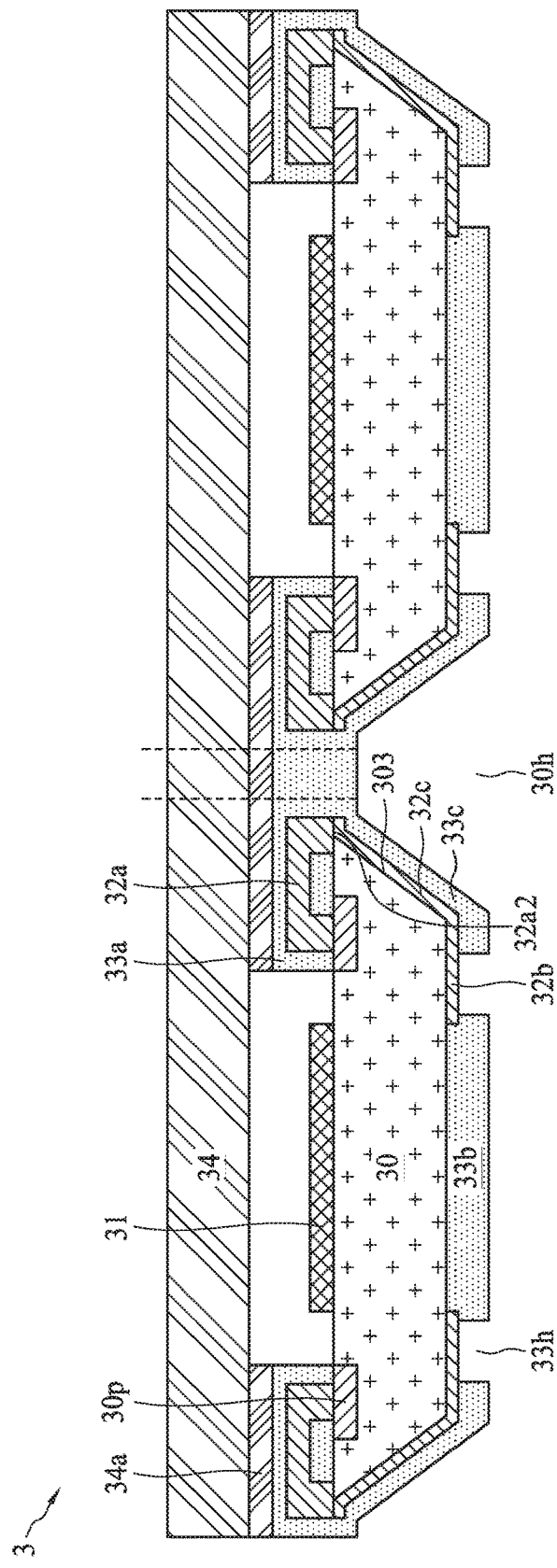

Referring to FIG. 3F, conductive layers 32b, 32c are formed on the back surface 301 and the lateral surface 303 of the die 30. The conductive layer 32c on the lateral surface 303 of the die 30 electrically connects the conductive layer 32b on the back surface 302 of the die 30 with the conductive layer 32a on the active surface 301 of the die 30. The conductive layer 32c contacts and extends along the bottom surface 32a2 (facing toward the active surface 301 of the die 30) of the conductive layer 32a that protrudes beyond the lateral surface 303 of the die 30. Therefore, a contacting interface between the conductive layers 32a and 32c is a plane or surface. For example, a connection between the conductive layers 32a and 32c is achieved by a plane-to-plane contact or surface-to-surface contact. For example, a contacting area between the conductive layers 32a and 32c is greater than a cross-sectional area of the conductive layer 32c. Compared to a connection between two conductive layers achieved by a point-to-point contact or a point-to-line contact, the connection (e.g., plane-to-plane contact) between the conductive layers 32a and 32c is relatively strong, which would increase the bonding strength between the conductive layers 32a and 32c and mitigate against an open circuit between the conductive layers 32a and 32c. In some embodiments, an insulation layer or a passivation layer may be formed between the conductive layers 32b, 32c and the die 30 to mitigate against electrical leakage.

Dielectric layers 33b, 33c are formed on the back surface 302 and the lateral surface 303 of the die 30 to cover the conductive layers 32b, 32c. The dielectric layer 33a defines openings 33h to expose portions of the conductive layer 32b.

Figure 3G:
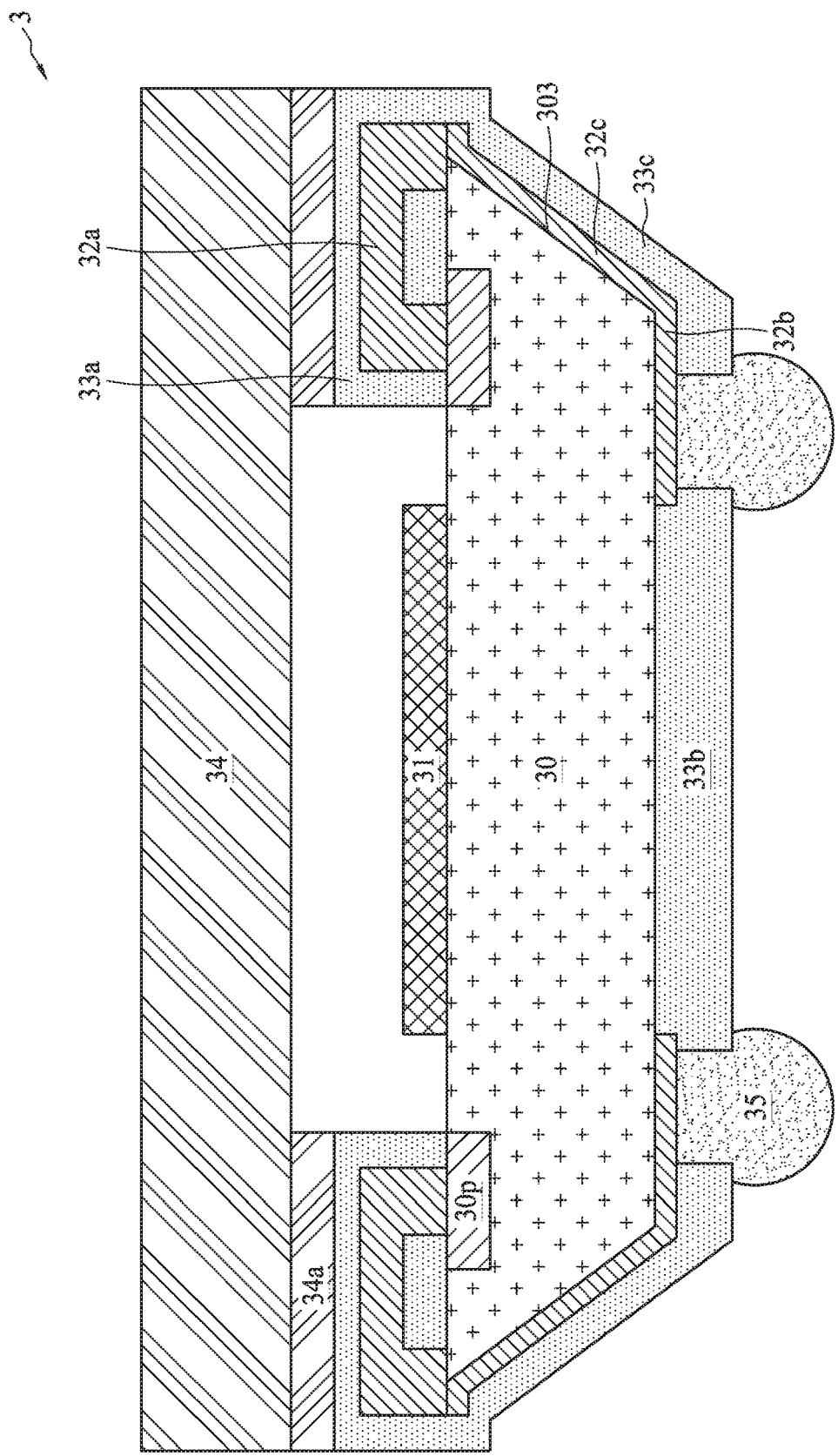

Referring to FIG. 3G, electrical contacts 35 are formed within respective openings 33h to electrically contact the exposed portions of the conductive layer 32b. A singulation process may be performed to separate out individual semiconductor package devices 3. That is, the singulation process is performed through the cover 34 and the dielectric layer 33a. The singulation process may be carried out, for example, by using a dicing saw, laser or other appropriate cutting technique. In some embodiments, the semiconductor package device 3 is the same as, or similar to, the semiconductor package device 1 shown in FIG. 1A.

Figure 4A:
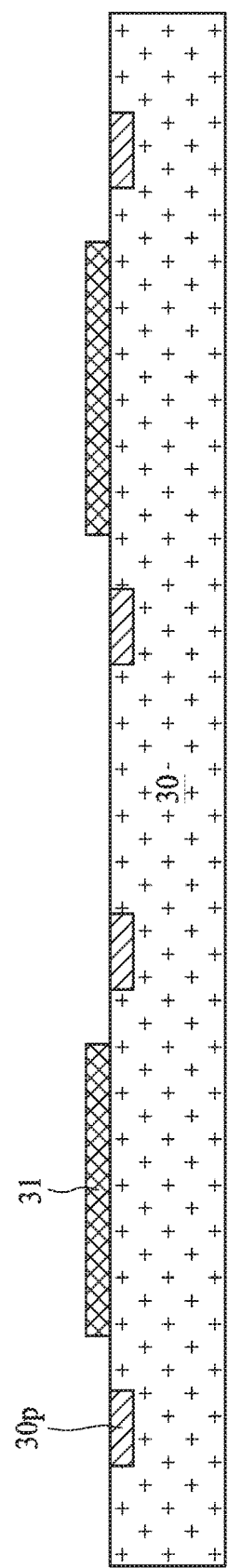
FIG. 4A, FIG. 4B, FIG. 4C, FIG. 4D, FIG. 4E, FIG. 4F and FIG. 4G illustrate various stages of a method of manufacturing a semiconductor package device in accordance with some embodiments of the present disclosure.
Figure 4B:
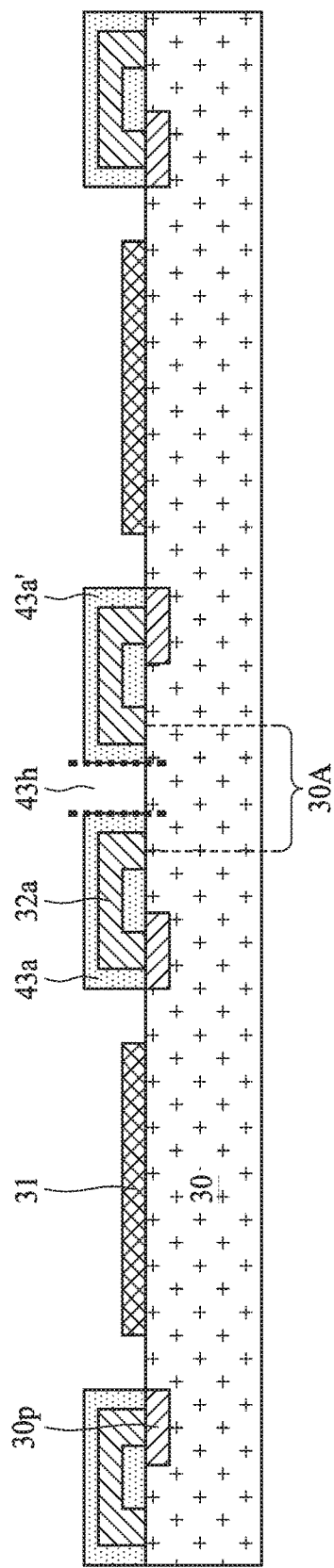
Figure 4C:
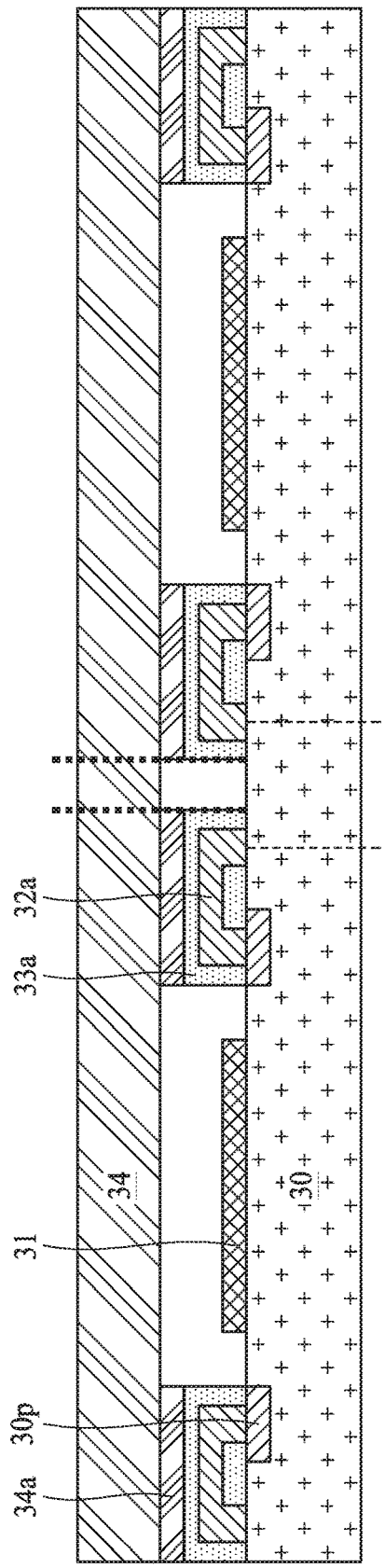
Figure 4D:
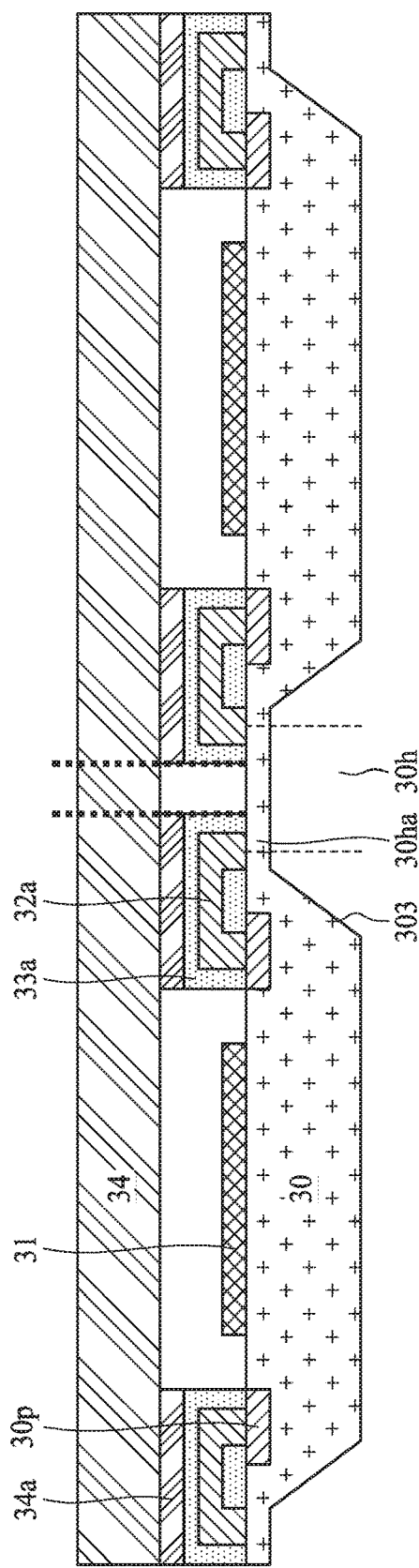
Figure 4E:
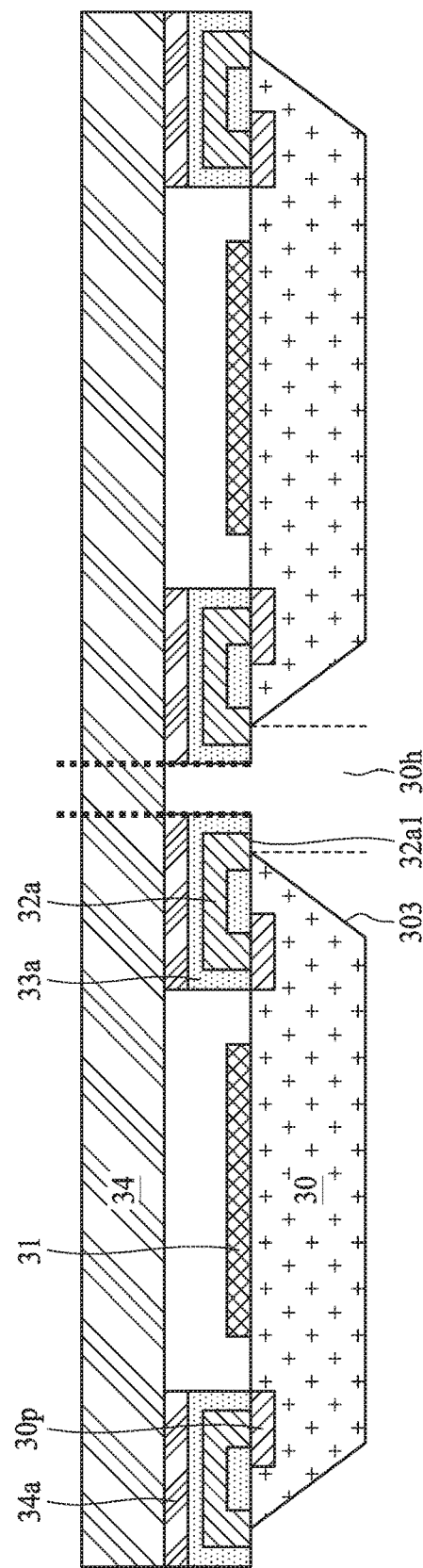
Figure 4F:
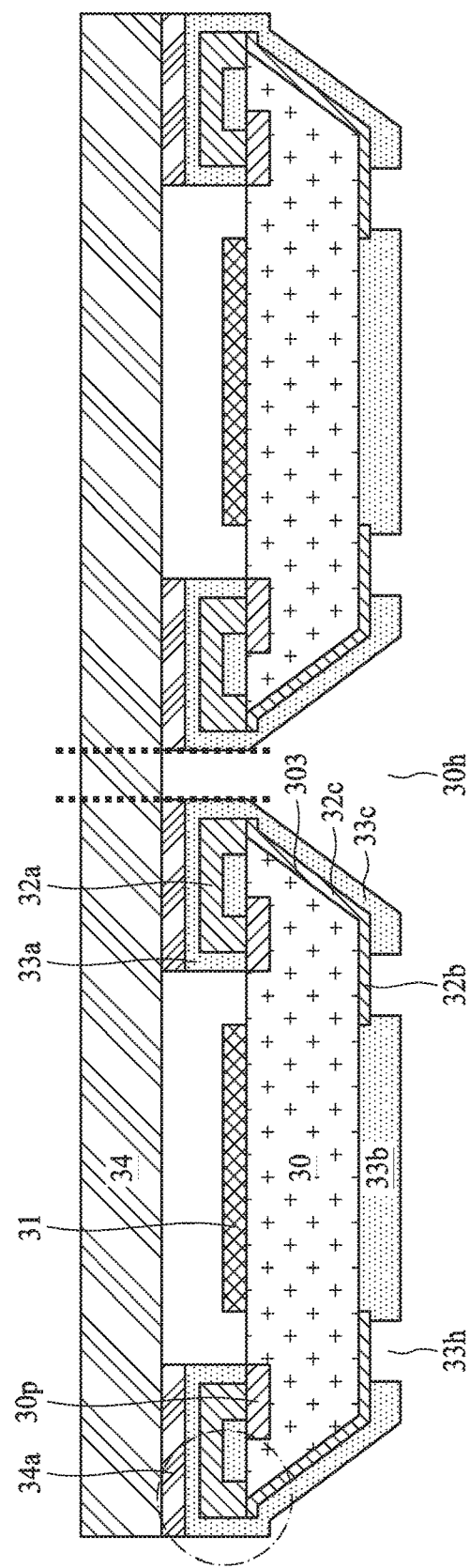
Figure 4G:
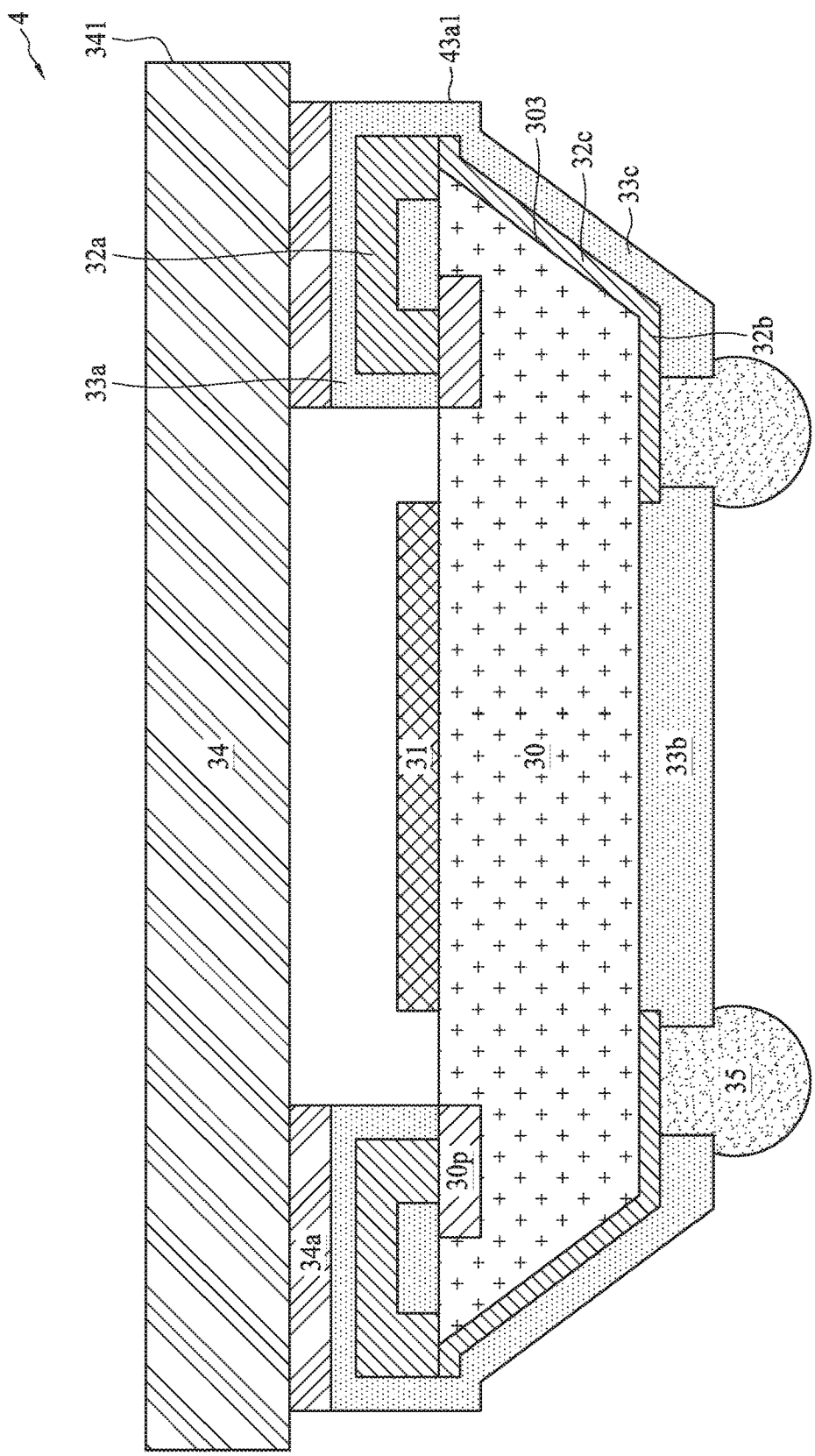

FIG. 4A through FIG. 4G are cross-sectional views of a semiconductor structure fabricated at various stages, in accordance with some embodiments of the present disclosure. The operations shown in FIG. 4A through FIG. 4G are similar to the operations shown in FIG. 3A through FIG. 3G, except that during the formation of dielectric layers 43a, 43a' shown in FIG. 4B, the dielectric layers 43a and 43a' of two adjacent dies 30 are not connected. Therefore, a gap 43h is formed between the dielectric layers 43a and 43a' of the two adjacent dies 30. Therefore, after the singulation process shown in FIG. 4G, the cover 34 protrudes beyond a lateral surface 43a1 of the dielectric layer 43a. For example, a lateral surface 341 of the cover 34 is not coplanar with the lateral surface 43a1 of the dielectric layer 43a. In some embodiments, a resulting semiconductor package device 4 shown in FIG. 4G is the same as, or similar to, the semiconductor package device 2 shown in FIG. 2.

FIG. 5A through FIG. 5G are cross-sectional views of a semiconductor structure fabricated at various stages, in accordance with some embodiments of the present disclosure. The operations shown in FIG. 5A through FIG. 5G are similar to the operations shown in FIG. 3A through FIG. 3G, except that the dielectric layer 33a is replaced by an adhesive 34a.

Figure 5A:
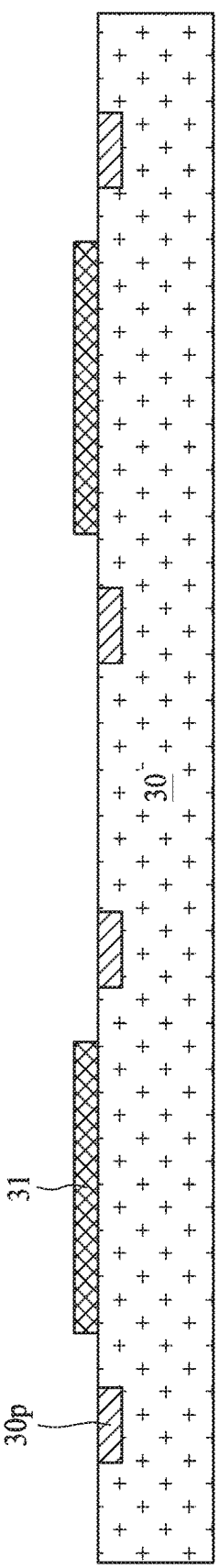
FIG. 5A, FIG. 5B, FIG. 5C, FIG. 5D, FIG. 5E, FIG. 5F and FIG. 5G illustrate various stages of a method of manufacturing a semiconductor package device in accordance with some embodiments of the present disclosure.
Figure 5B:
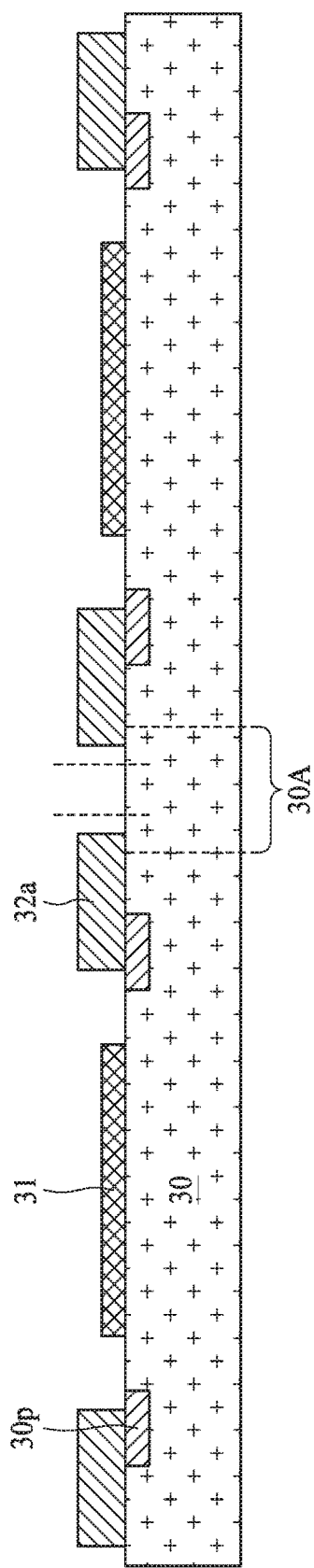
Figure 5C:
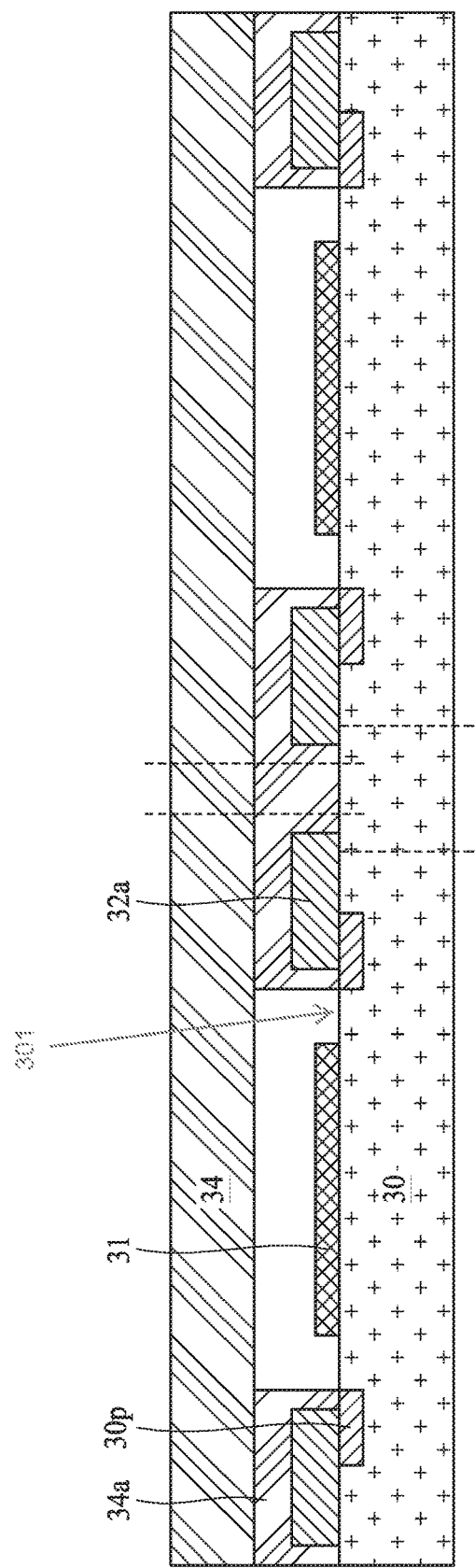
Figure 5D:
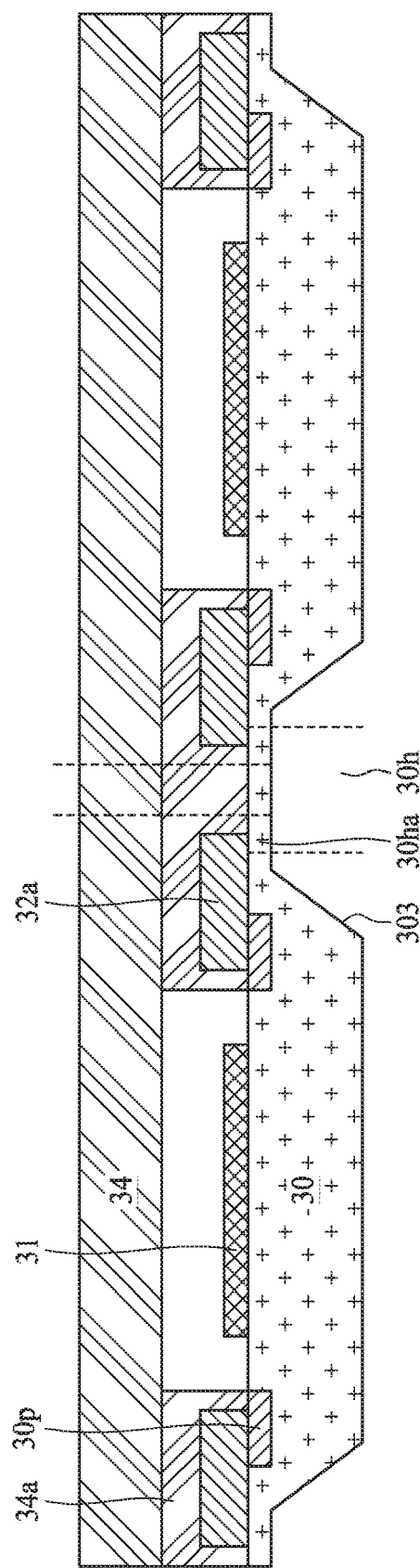
Figure 5E:
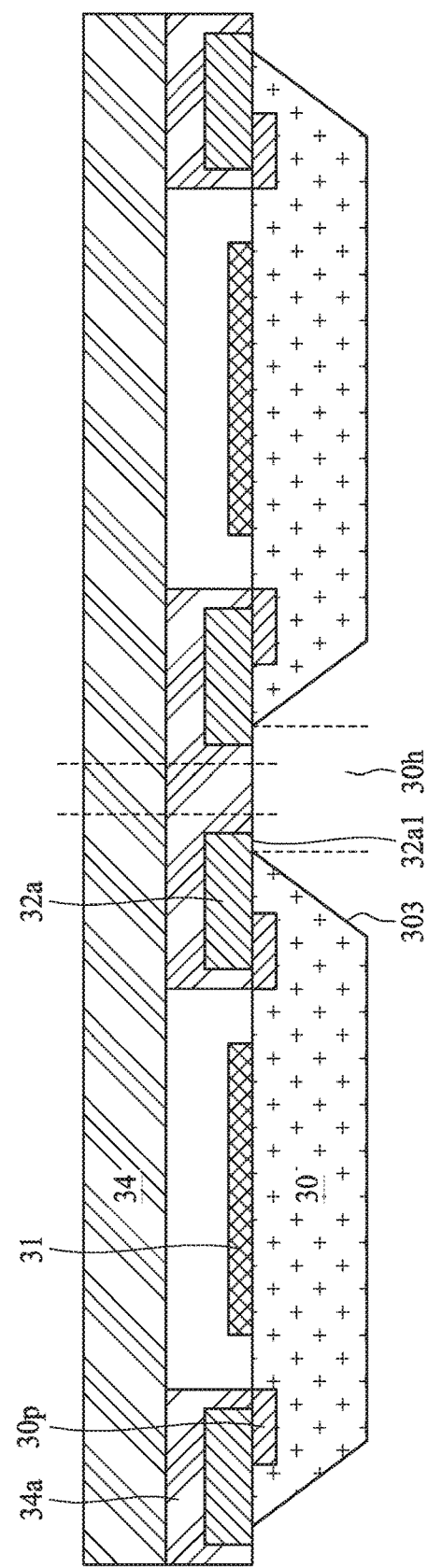
Figure 5F:
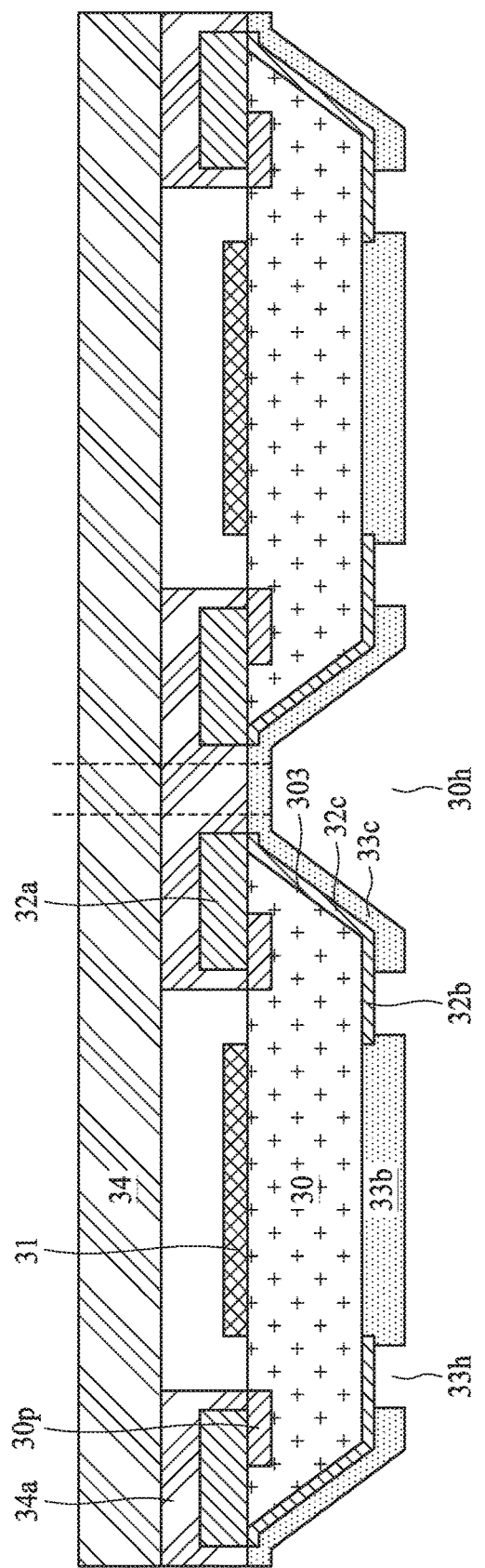
Figure 5G:
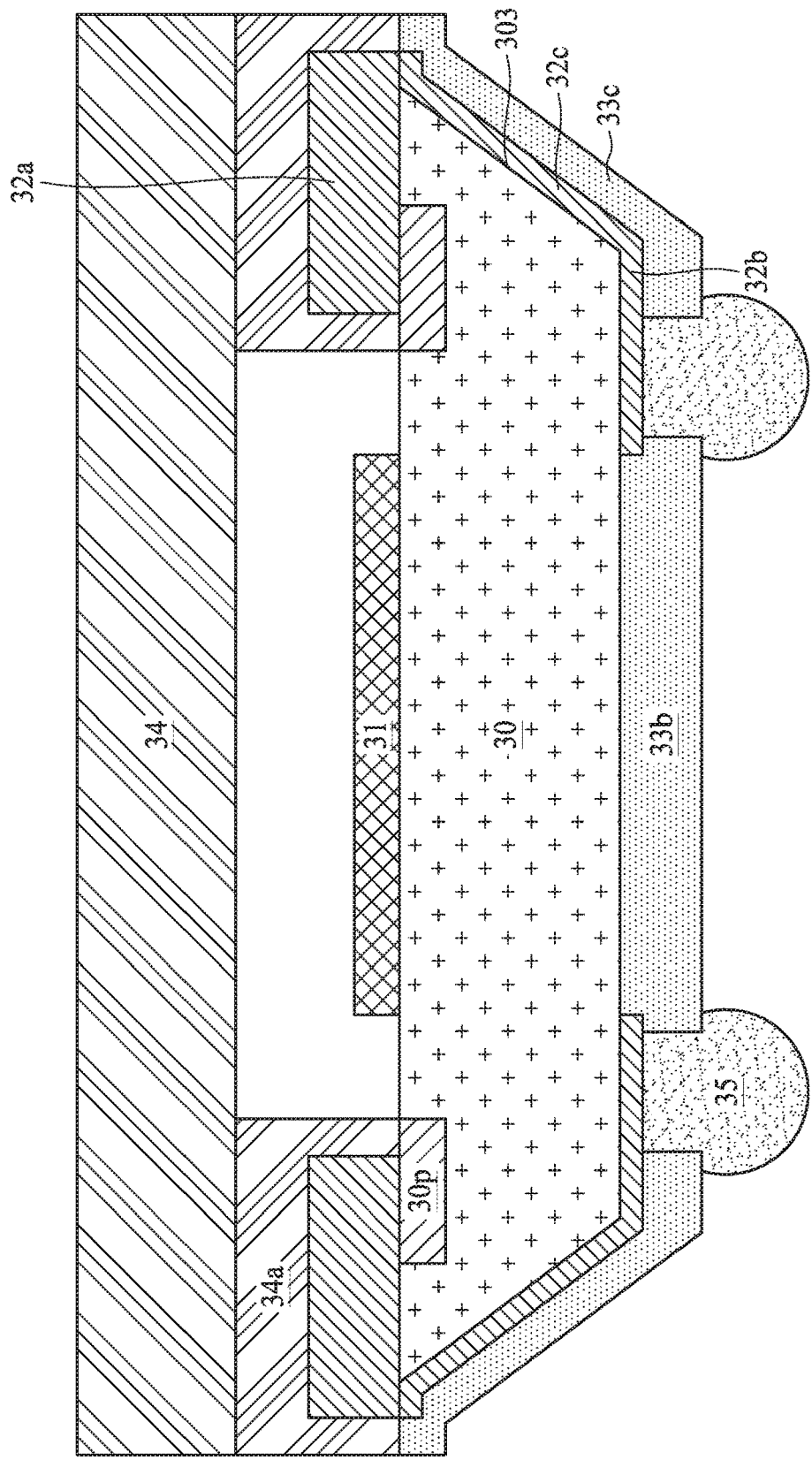

As shown in FIG. 5C, after the conductive layer 32a is formed on the active surface 301 of the die 30, the adhesive 34a is formed or disposed to cover the conductive layer 32a. The cover 34 is then attached to the adhesive 34a. By replacing the dielectric layer 33a with the adhesive 34a, the manufacturing cost and time can be reduced.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An image sensor, comprising:
    a chip having a first surface, a second surface opposite to the first surface and a lateral surface extending between the first surface and the second surface;
    a first redistribution layer (RDL) on the first surface of the chip and extending along the first surface of the chip and beyond the lateral surface of the chip;
    a second RDL on the second surface of the chip; and
    a third RDL on the lateral surface of the chip and connecting the first RDL to the second RDL,
    wherein the third RDL includes a first portion extending along the lateral surface of the chip and a second portion extending away from the lateral surface of the chip, the second portion of the third RDL contacts a portion of the first RDL that protrudes beyond the lateral surface of the chip, and the second portion of the third RDL protrudes beyond a lateral surface of the portion of the first RDL that protrudes beyond the lateral surface of the chip.

2. The image sensor of claim 1, wherein the second portion of the third RDL extends away from the lateral surface of the chip along a direction substantially parallel to the first surface of the chip.

3. The image sensor of claim 1, wherein a contacting area of the first RDL and the third RDL is greater than a cross-sectional area of the third RDL.

4. The image sensor of claim 1, further comprising:
    a first dielectric layer covering the first RDL;
    a second dielectric layer covering the second RDL; and
    a third dielectric layer covering the third RDL.

5. The image sensor of claim 1, wherein the chip comprises a micro-lens array disposed on the first surface of the chip.

6. The image sensor of claim 1, further comprising a cover on the first surface of the chip.

7. The image sensor of claim 1, wherein the lateral surface of the chip is not perpendicular to the first surface or the second surface of the chip.

8. The image sensor of claim 1, wherein the lateral surface of the chip and the first surface of the chip define an acute angle.

9. An image sensor, comprising:
    a chip having a first surface, a second surface opposite to the first surface and a lateral surface extending between the first surface and the second surface;
    a micro-lens array on the first surface of the chip;
    a first RDL on the first surface of the chip and including a protruded portion extending beyond the lateral surface of the chip; and
    a second RDL on the lateral surface of the chip and contacting the protruded portion of the first RDL, wherein a contacting area of the first RDL and the second RDL is greater than a cross-sectional area of the second RDL, wherein
    the second RDL includes a first portion extending along the lateral surface or the chip, and a second portion that extends away from the lateral surface of the chip along a direction substantially parallel to the first surface of the chip,
    the protruded portion if the first RDL has a surface facing toward the first surface of the chip; and
    the surface of the protruded portion of the first RDL contracts the second portion of the second RDL.

10. The image sensor of claim 9, further comprising a third RDL on the second surface of the chip and electrically connected to the first RDL through the second RDL.

11. The image sensor of claim 9, wherein the second portion of the second RDL protrudes beyond a lateral surface of the protruded portion of the first RDL.

12. The image sensor of claim 9, further comprising dielectric layers covering the first RDL and the second RDL.

13. The image sensor of claim 9, further comprising a cover on the first surface of the chip to cover the micro-lens array.

14. The image sensor of claim 9, wherein the lateral surface of the chip and the first surface of the chip define an acute angle.

15. The image sensor of claim 9, wherein a lateral surface of the second portion of the second RDL is substantially coplanar with a lateral surface of the protruded portion of the first RDL.

* * * * *